United States Patent
Lin (10) Patent No.: US 10,276,662 B2
(45) Date of Patent: Apr. 30, 2019

(54) METHOD OF FORMING CONTACT TRENCH

(71) Applicant: Taiwan Semiconductor Manufacturing Co., Ltd., Hsin-Chu (TW)

(72) Inventor: Chih-Han Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/168,323

(22) Filed: May 31, 2016

(65) Prior Publication Data

US 2017/0345759 A1 Nov. 30, 2017

(51) Int. Cl.
  *H01L 21/02* (2006.01)
  *H01L 21/768* (2006.01)
  (Continued)

(52) U.S. Cl.
  CPC .... *H01L 29/0847* (2013.01); *H01L 21/76897* (2013.01); *H01L 21/823475* (2013.01);
  (Continued)

(58) Field of Classification Search
  CPC ........... H01L 21/02532; H01L 21/2652; H01L 21/823412; H01L 21/22; H01L 21/225; H01L 21/2256; H01L 21/2253; H01L 21/28176; H01L 21/2818; H01L 21/823814; H01L 21/84; H01L 21/32133;
  (Continued)

(56) References Cited

U.S. PATENT DOCUMENTS

| 7,667,271 | B2 | 2/2010 | Yu et al. |
| 7,910,453 | B2 | 3/2011 | Xu et al. |

(Continued)

FOREIGN PATENT DOCUMENTS

| JP | 2005049122 | 2/2005 |
| KR | 20080036774 | 4/2008 |

(Continued)

OTHER PUBLICATIONS

Taiwanese Application No. 10521150360, Office Action dated Sep. 19, 2016, 11 pgs.

(Continued)

*Primary Examiner* — Natalia A Gondarenko
(74) *Attorney, Agent, or Firm* — Haynes and Boone, LLP (57) ABSTRACT

A method of fabricating a semiconductor device is disclosed. The method includes forming a first gate stack and a second gate stack over a substrate. Each of them has gate spacers disposed along its respective sidewalls. The method also includes forming a source/drain (S/D) feature disposed between the first and second gate stacks. The gate spacers and a top surface of the S/D feature define a space. The method also includes forming a first dielectric layer over the S/D feature in the space, forming a capping layer along the gate spacers in the space, forming a second dielectric layer over the first dielectric layer in the space and forming a contact trench extending through the second dielectric layer, the first dielectric layer and the capping layer to expose the top surface of the S/D feature.

16 Claims, 10 Drawing Sheets

(51) Int. Cl.
*H01L 21/336* (2006.01)
*H01L 21/8234* (2006.01)
*H01L 21/762* (2006.01)
*H01L 29/08* (2006.01)
*H01L 23/525* (2006.01)
*H01L 23/528* (2006.01)
*H01L 23/535* (2006.01)
*H01L 29/78* (2006.01)
*H01L 27/092* (2006.01)
*H01L 27/11521* (2017.01)
*H01L 29/423* (2006.01)

(52) U.S. Cl.
CPC .... *H01L 29/785* (2013.01); *H01L 21/823425* (2013.01); *H01L 21/823431* (2013.01)

(58) Field of Classification Search
CPC ....... H01L 21/76224; H01L 21/823807; H01L 21/8234; H01L 21/823481; H01L 21/8238; H01L 21/823431; H01L 21/823437; H01L 21/823821; H01L 21/283–21/2885; H01L 21/76877; H01L 21/76879–21/76883; H01L 21/76897; H01L 29/0649; H01L 29/0878; H01L 29/0847; H01L 29/66; H01L 29/66636; H01L 29/6659; H01L 29/66795; H01L 29/66477; H01L 29/78618; H01L 29/78; H01L 29/785; H01L 21/76895; H01L 21/76829; H01L 21/76816; H01L 21/76805; H01L 21/823871; H01L 21/768; H01L 2029/7858; H01L 2924/13067
USPC ......... 257/369, 368, 288; 438/151, 197, 199
See application file for complete search history.

(56) References Cited

U.S. PATENT DOCUMENTS

| | | | |
|---|---|---|---|
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,337,094 B1* | 5/2016 | Pranatharthiharan | H01L 21/76897 |
| 9,391,204 B1* | 7/2016 | Cheng | H01L 29/785 |
| 9,397,003 B1* | 7/2016 | Niimi | H01L 21/823418 |
| 9,773,887 B2* | 9/2017 | Wang | H01L 21/0332 |
| 2002/0079492 A1* | 6/2002 | Koga | H01L 21/28247 257/66 |
| 2009/0147364 A1 | 6/2009 | Kotoku et al. | |
| 2010/0266938 A1 | 10/2010 | Hosoya | |
| 2012/0273848 A1* | 11/2012 | Fan | H01L 21/823418 257/288 |
| 2013/0115547 A1 | 5/2013 | Mikami et al. | |
| 2013/0181261 A1* | 7/2013 | Basker | H01L 29/78 257/288 |
| 2014/0001574 A1 | 1/2014 | Chen et al. | |
| 2014/0063490 A1 | 3/2014 | Zhang et al. | |
| 2014/0070285 A1* | 3/2014 | Xie | H01L 29/66545 257/288 |
| 2014/0110755 A1 | 4/2014 | Colinge | |
| 2014/0151812 A1 | 6/2014 | Liaw | |
| 2014/0272678 A1 | 9/2014 | Shih et al. | |
| 2015/0340467 A1* | 11/2015 | Bouche | H01L 29/66795 257/401 |
| 2016/0035857 A1* | 2/2016 | Leobandung | H01L 29/665 257/288 |
| 2016/0116648 A1 | 4/2016 | Van De Kruijs et al. | |

FOREIGN PATENT DOCUMENTS

| | | |
|---|---|---|
| TW | 200941148 | 10/2009 |
| TW | 201414996 | 4/2014 |
| TW | 201435481 | 9/2014 |
| TW | 201502061 | 1/2015 |
| TW | 201525607 | 7/2015 |
| WO | WO 2012014904 | 2/2012 |

OTHER PUBLICATIONS

Korean Application No. 1020150143299, Office Action dated Sep. 21, 2016, 17 pgs.

* cited by examiner

METHOD OF FORMING CONTACT TRENCH

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of fabricating FinFET devices have been generally adequate for their intended purposes, they have not been entirely satisfactory in all respects. For example, improvements in the process of forming a contact trench are desired.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices. The following disclosure will continue with a FinFET example to illustrate various embodiments of the present invention. It is understood, however, that the application should not be limited to a particular type of device, except as specifically claimed.

Figure 1:
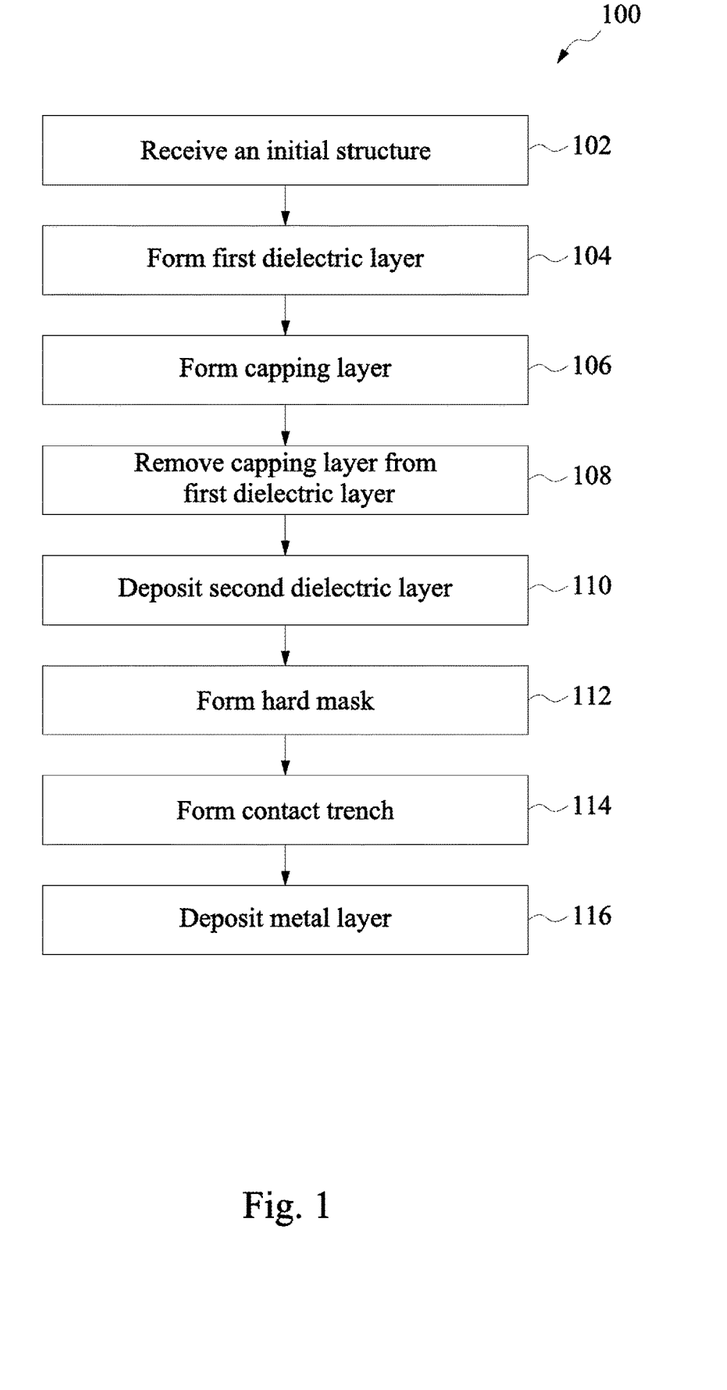
FIG. 1 is a flowchart of an example method for fabricating a semiconductor device constructed in accordance with some embodiments.

FIG. 1 is a flowchart of a method 100 of fabricating one or more semiconductor devices in accordance with some embodiments. The method 100 is discussed in detail below, with reference to an initial structure 205 of a semiconductor device 200 showed in FIGS. 2A and 2B, and the semiconductor device 200 shown in FIGS. 3A through 9D.

Figure 2A:
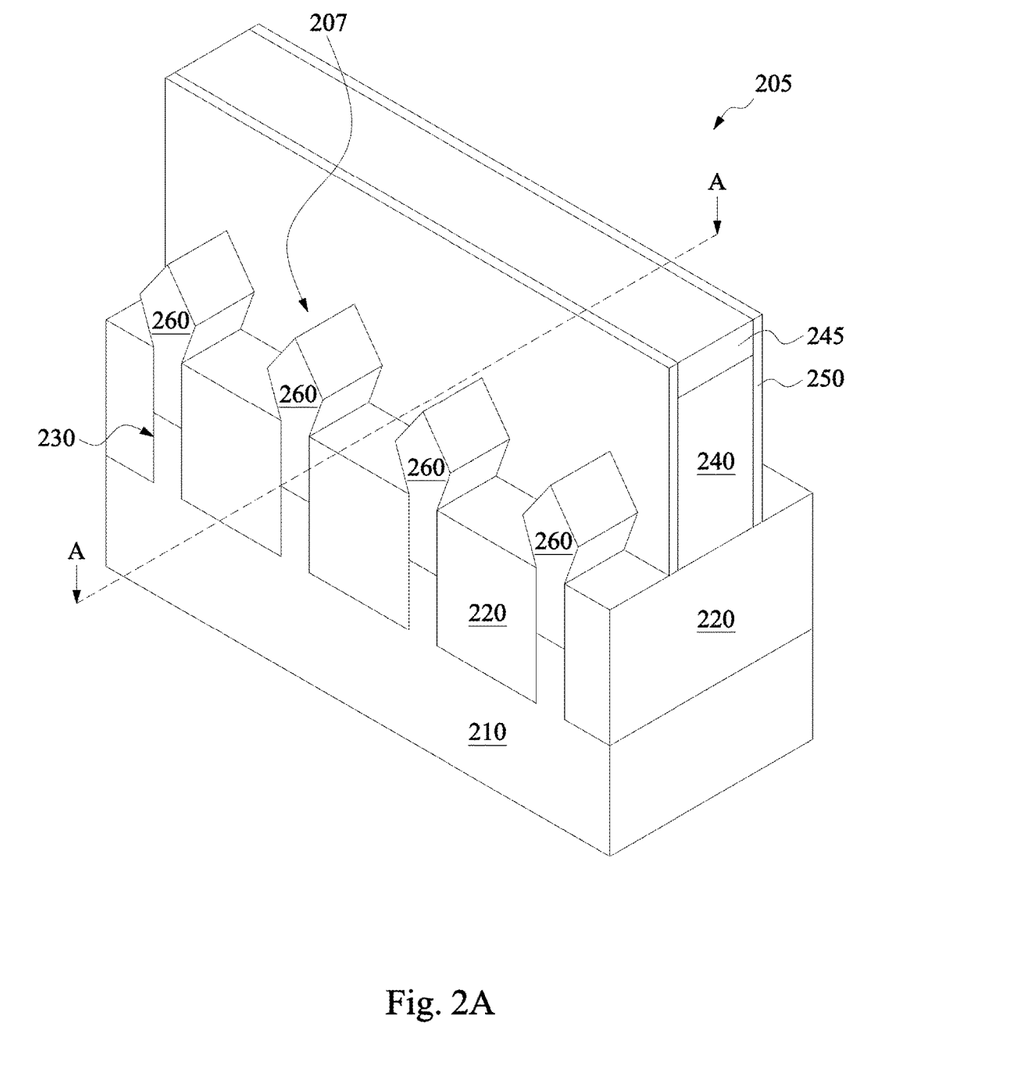
FIG. 2A is a diagrammatic perspective view of an initial structure of an example semiconductor device in accordance with some embodiments.
Figure 2B:
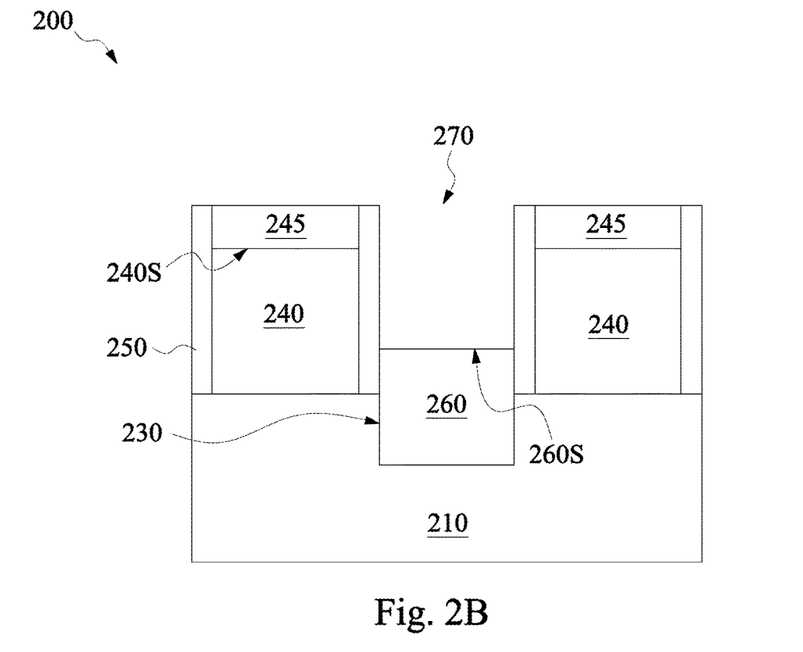
FIG. 2B is a cross section view of an example of the initial structure in accordance with some embodiments, along the line A-A in FIG. 2A.

Referring to FIGS. 1, 2A and 2B, method 100 starts at step 102 by receiving the initial structure 205 of the semiconductor device 200. The initial structure 205 includes a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary semiconductor device 200, the insulator layer is a component (e.g., layer) of a silicon-on-insulator substrate.

The substrate 210 may also include various doped regions. The doped regions may be doped with p-type dopants, such as boron or $BF_2$; n-type dopants, such as phosphorus or arsenic; and/or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

The substrate 210 may also include various isolation features 220. The isolation features 220 separate various device regions in the substrate 210. The isolation features 220 include different structures formed by using different processing technologies. For example, the isolation features 220 may include shallow trench isolation (STI) features. The formation of an STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The initial structure 205 also includes a plurality of fin features 230 formed over the substrate 210. The fin feature 230 may include silicon (Si), silicon germanium (SiGe), silicon germanium tin (SiGeSn), gallium arsenic (GaAs), gallium phosphide (GaP), indium phosphide (InP), indium arsenide (InAs), and/or other suitable materials. In some embodiments, the fin feature 230 is formed by any suitable process including various deposition, photolithography, and/or etching processes. As an example, the fin feature 230 is formed by patterning and etching a portion of the substrate 210.

The initial structure 205 also includes a plurality of first conductive features 240 over the substrate 210. In some embodiments, the first conductive feature 240 may be gate structures including high-k/metal gate stacks (HK/MGs) wrapping over a portion of the fin features 230. Alternatively, in some embodiment, the first conductive feature 240 may also include a portion of the interconnect structure, such as a contact, a metal via, and/or metal line. In one embodiment, the first conductive features 240 include electrodes, capacitors, resistors and/or a portion of a resistor. For the purpose of simplicity and clarity, the first conductive feature 240 is referred to as the HK/MG 240.

The HK/MGs 240 may include gate dielectric layer and MG electrode layer. The gate dielectric layer of HK/MGs 240 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The gate dielectric layers may be deposited by a suitable method, such as chemical vapor deposition (CVD), atomic layer deposition (ALD), thermal oxidation or ozone oxidation, other suitable technique, and/or a combination thereof.

The MG electrode layer may include a single layer or multi layers, such as a metal layer, a liner layer, a wetting layer, and an adhesion layer. The MG may include Ti, Ag, Al, TiAlN, TaC, TaCN, TaSiN, Mn, Zr, TiN, TaN, Ru, Mo, Al, WN, Cu, W, or any suitable materials. The MG may be formed by ALD, physical vapor deposition (PVD), CVD, and/or other suitable process.

In some embodiments, dummy gate stacks are formed first and then are replaced later by HK/MGs 240 after high thermal temperature processes are performed, such as thermal processes during source/drain formation. The dummy gate stack may include a dummy gate dielectric layer and a polysilicon layer and may be formed by deposition, patterning and etching processes.

In some embodiments, a gate hard mask (HM) 245 is formed on top of each of the HK/MGs 240 to provide protection in subsequent etch processes. The gate HM 245 may include titanium (Ti), titanium oxide, TiN, TiSiN, tantalum (Ta), tantalum oxide, TaN, TaSiN, silicon nitride, silicon oxide, silicon carbide, silicon carbide nitride, manganese (Mn), cobalt (Co), ruthenium (Ru), WN, aluminum nitride, aluminum oxide, and/or other suitable material. The gate HM 245 may be formed by deposition, lithography patterning and etch processes.

In some embodiments, gate spacers 250 may be formed along the sidewalls of the HK/MGs 240. The gate spacers 250 may include silicon oxide, a dielectric material having a dielectric constant (k) lower than thermal silicon oxide (therefore referred to as low-k dielectric material layer), and/or other suitable dielectric material layer. The gate spacers 250 may be formed by depositing a gate spacer layer and then anisotropically dry etching the gate spacer layer.

The initial structure 205 also may include second conductive features 260 over the substrate 210. In some embodiments, the second conductive features 260 are source/drain (S/D) features, beside and separated by the HK/MG 240. Alternatively, in some embodiment, the second conductive feature 260 may also include a portion of the interconnect structure, such as a contact, metal via, or metal line. In one embodiment, the first conductive features 260 include electrodes, capacitors, resistors or a portion of a resistor. For the purpose of simplicity and clarity, the second conductive feature 260 is referred to as the S/D features 260 hereinafter.

Here, one of the S/D features 260 is a source feature and another of the S/D features 260 is a drain feature. As shown, the S/D features 260 are separated by the HK/MG 240. In one embodiment, a portion of the substrate 210, beside the HK/MG 240 is recessed to form S/D recesses and then the S/D features 250 are formed over the S/D recesses by epitaxial growing processes, such as CVD, VPE and/or UHV-CVD, molecular beam epitaxy, and/or other suitable processes.

The S/D features 260 may include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or other suitable materials. The S/D features 260 may be formed by epitaxial growing processes, such as CVD deposition techniques (e.g., vapor-phase epitaxy (VPE) and/or ultra-high vacuum CVD (UHV-CVD)), molecular beam epitaxy, and/or other suitable processes. After the S/D recesses are filled with the S/D feature 260, further epitaxial growth of a top layer of the S/D features 260 expands horizontally and facets may start to form, such as a diamond shape facets. The S/D features 260 may be in-situ doped during the epi processes. Alternatively, the S/D feature 260 is not in-situ doped, an implantation process (i.e., a junction implant process) is performed to dope the S/D feature 260. One or more annealing processes may be performed to activate dopants. The annealing processes comprise rapid thermal annealing (RTA) and/or laser annealing processes. In some embodiments, a top surface 260S of the S/D feature 260 is below a top surface 240S of the HK/MG stack 240. As a result, a space 270 is defined by the gate spacers 250 and the top surface 260S.

Typically, a dielectric layer will be formed over the substrate 210, including fully filling in the space 270 and extending above the HK/MG stack 240. Then, a contact trench will be formed in the dielectric layer to expose the S/D feature 260 and follows by depositing a metal layer to contact the S/D feature for electric connection. Be formed through the dielectric layer to reach the S/D feature 260, the contact trench is a quite deep trench. In other words, the trench etching process is a deep trench etching process.

During this deep etching process, the gate spacer 250 may experience a loss (i.e. portions of the spacers are removed), which may results in a gate leakage issue. To address this issue, the present disclosure provides methods of forming a contact trench with a protection layer for the gate spacer 250.

Figure 3A:
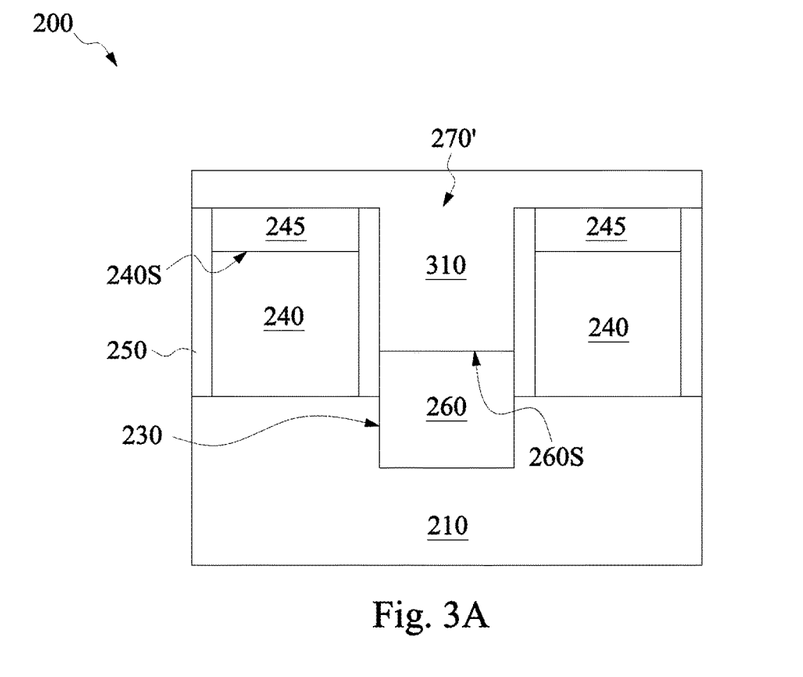
FIGS. 3A, 3B, 4, 5, 6, 7A, 7B, 7C, 8A, 8B, 8C, 9A, 9B, 9C and 9D are cross-sectional views of an example semiconductor device in accordance with some embodiments, along the line A-A in FIG. 2A.
Figure 3B:
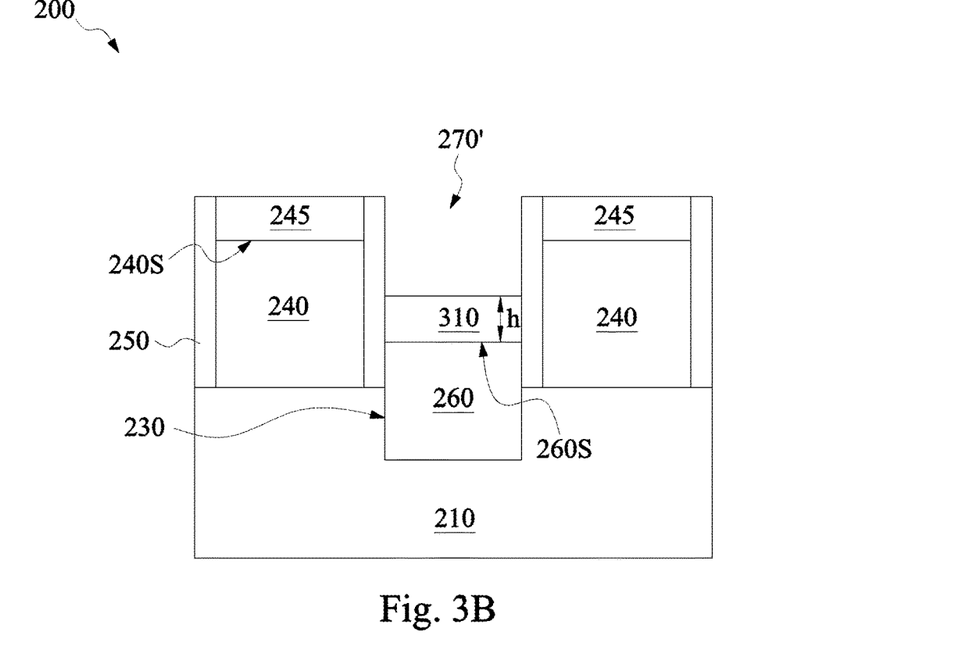

Referring to FIGS. 1, 3A and 3B, once the initial structure 205 is received, method 100 proceeds to step 104 by forming a first dielectric layer 310 to partially filling in the space 270. After filled in by the first dielectric layer 310, a remaining space 270' is still present. In the present embodiment, a thickness of the first dielectric layer 310 is controlled to have a height h above the top S/D surface 260S. The first dielectric layer 310 may include silicon oxide, low-k dielectric material, and/or other suitable dielectric material layer. In various examples, the low k dielectric material may include fluorinated silica glass (FSG), carbon doped silicon oxide, amorphous fluorinated carbon, Parylene, BCB (bis-benzocyclobutenes), SiLK (Dow Chemical), polyimide, and/or other materials as examples. In another example, the low k dielectric material may include an extreme low k dielectric material (XLK). In yet another example, the low k dielectric material layer includes a porous version of an existing Dow Corning dielectric material called FOX (flowable oxide) which is based on hydrogen silsesquioxane. The first dielectric layer 310 may be deposited by CVD, ALD, spin-on coating, and/or other techniques.

In some embodiments, the first dielectric layer 310 is deposited into space 270 and then recesses back to the height h by a selective etch process which etches the first dielectric layer 310 without etching the gate HM 245 and the gate spacers 250. The etch process may include a selective wet etch, a selective dry etch, and/or a combination of. In the present embodiment, a deposition thickness of the first dielectric layer 310 is controlled such that the recess process is a shallow etch process, which results in a less constrains for achieving etch selectivity.

Figure 4:
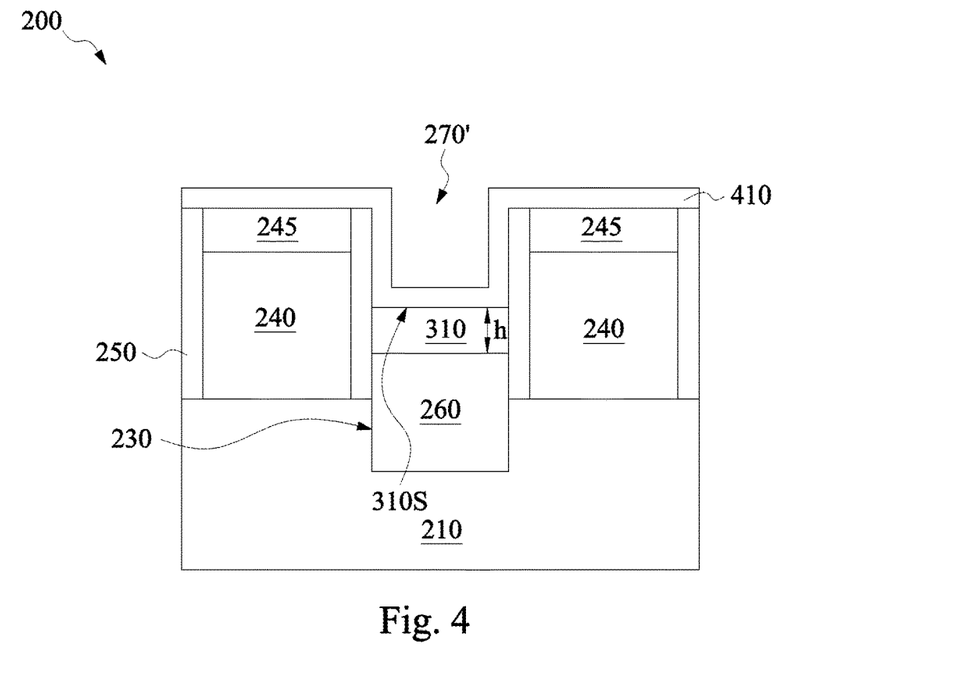

Referring to FIGS. 1 and 4, method 100 proceeds to step 106 by depositing a capping layer 410 over the gate HM 245, along gate spacers 250 and on a top surface 310S of the first dielectric layer 310. The capping layer 410 may include silicon nitride, silicon carbide, and/or other suitable material. In the present embodiment, the capping layer 410 is different from the gate spacer 250 to achieve etching selectivity during a subsequent etch as described in more detail below. For example, the capping layer 410 includes silicon nitride while the gate spacer 250 includes low-k dielectric material. The capping layer 410 may be deposited by CVD, ALD, spin-on coating, and/or other techniques.

Figure 5:
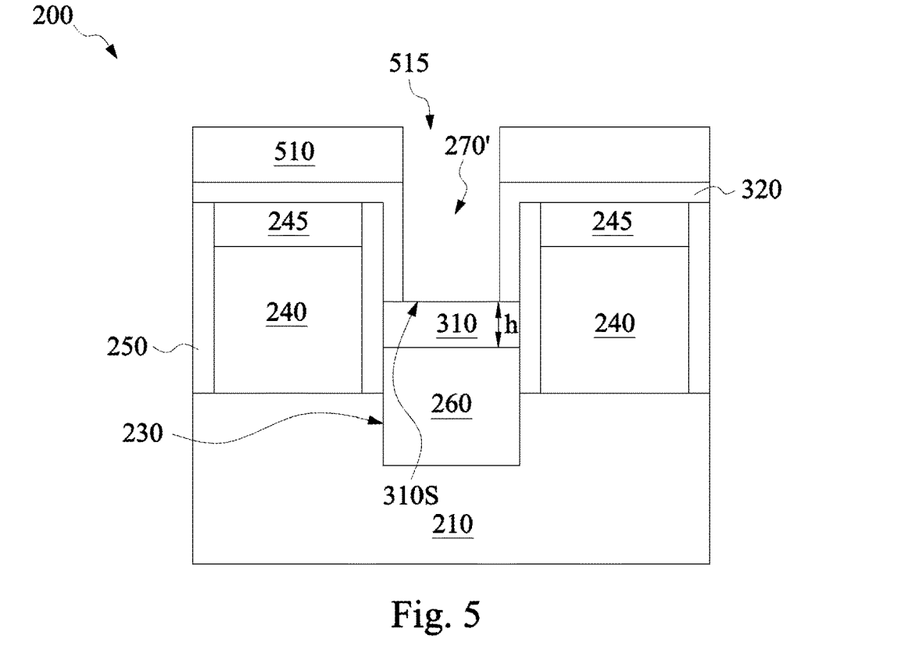

Referring to FIGS. 1 and 5, method 100 proceeds to step 108 by removing the capping layer 410 from the top surface 310S to expose the first dielectric layer 310. In some embodiments, a patterned photoresist layer 510 is formed over the capping layer 410, which has an opening 515 and a portion of the capping layer 410, which is over the first dielectric layer 310, is exposed within the opening 515. The capping layer 410 is then etched through the opening 515. An exemplary lithography process may include forming a photoresist layer, exposing the photoresist layer by a lithography exposure process, performing a post-exposure bake process, and developing the photoresist layer to form the patterned resist layer. The etch process may include a wet etch, a dry etch, and/or a combination thereof. After removing the capping layer 410 from the top surface 310S, the pattered photoresist layer 510 is removed by wet stripping and/or plasma ashing.

Figure 6:
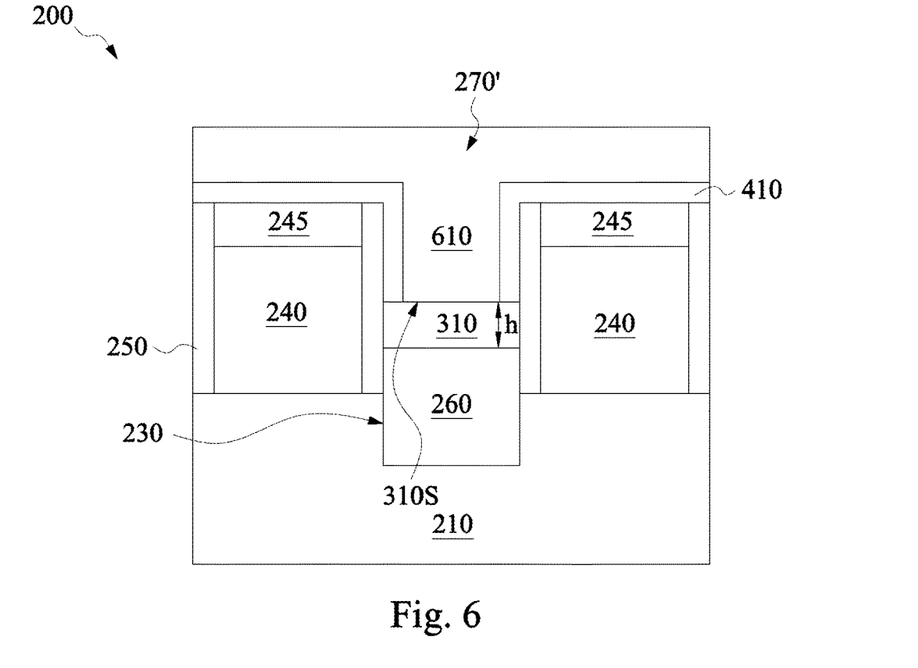

Referring to FIGS. 1 and 6, method 100 proceeds to step 110 by depositing a second dielectric layer 610 over the substrate 210, including filling in the remaining space 270'. As shown, the second dielectric layer 610 completely (or fully) fills in the remaining space 270' that remaining after step 108. In some embodiments, the second dielectric layer 610 physically contacts the first dielectric layer 310. In the present embodiment, a thickness of the second dielectric layer 610 is controlled such that the second dielectric layer 610 is also formed over (or above) the gate HM stack 245 to provide electric insolation for the gate stacks 240. The second dielectric layer 610 may include silicon oxide, low-k dielectric material, and/or other suitable dielectric material layer. The second dielectric layer 610 may be deposited by CVD, ALD, spin-on coating, and/or other technique. In an embodiment, the second dielectric layer 610 is formed of the same material as the first dielectric layer 310.

Figure 7A:
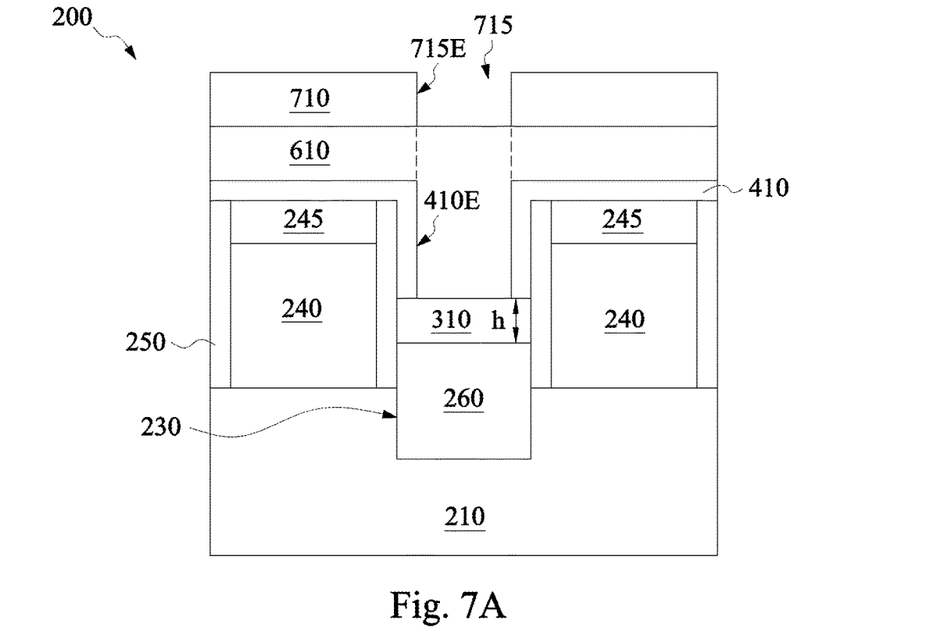

Referring to FIGS. 1 and 7A, method 100 proceeds to step 112 by forming a HM 710 having an opening 715 over the second dielectric layer 610. As shown, opening 715 is positioned (or aligned) over one or more designated S/D features 250. In one embodiment, the HM 710 is a patterned photoresist layer. In another embodiment, the HM 710 is formed by depositing a HM layer over the second dielectric layer 610, depositing photoresist layer over the HM layer, patterning the photoresist layer, then etching the HM layer through patterned photoresist layer to pattern the HM layer and then etching the HM layer through the patterned HM layer to form the opening 715 in the HM 710. In some embodiments, the material of HM layer 710 is different than the material of the gate HM 245. For example, the HM 710 is titanium nitride while the gate HM 245 is silicon nitride.

Figure 7B:
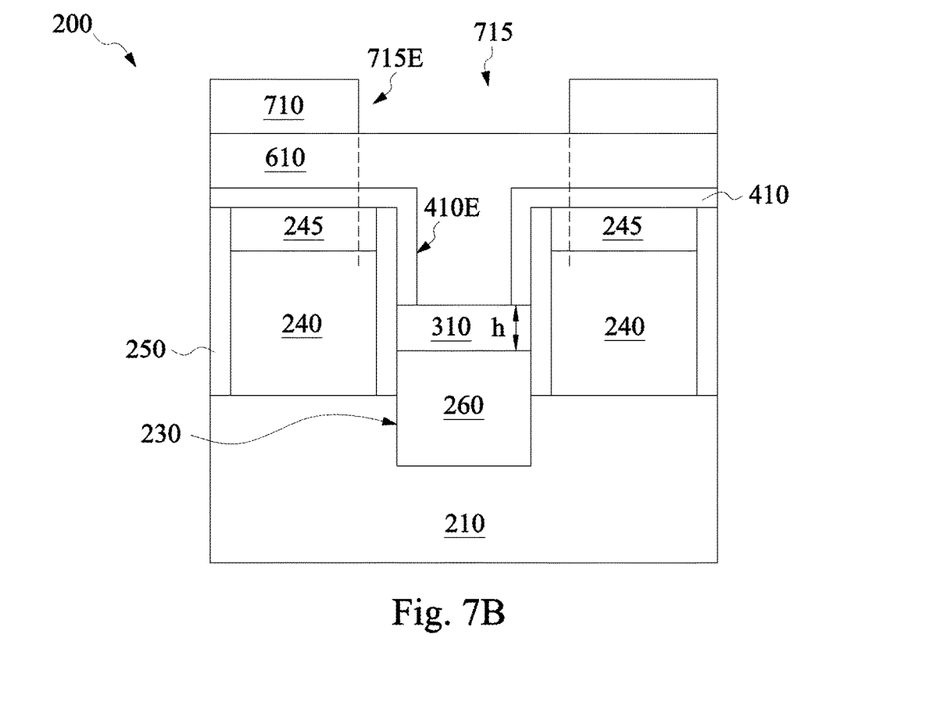
Figure 7C:
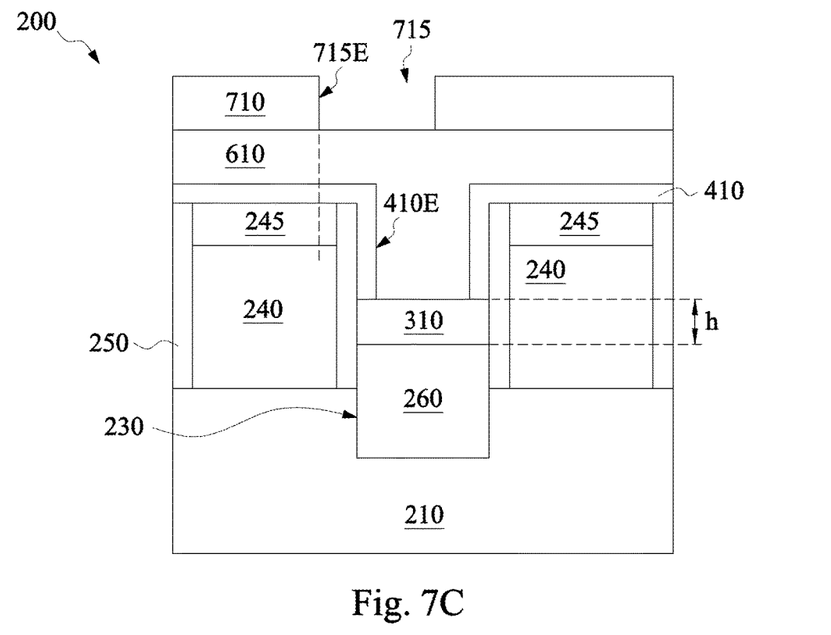

In some embodiments, edges 715E of the opening 715 align to, or inside of, the respective edges 410E of the capping layer 410, as shown in FIG. 7A. Alternatively, in some embodiments, the opening 715 is formed with a greater width such that it extends to both sides of adjacent HK/MGs 240 (with the gate HM 245) to obtain advantages, such as relaxing lithography process resolution constrains, as shown in FIG. 7B. In some embodiments, the 715 is aligned to one side. FIG. 7C shows such an example, opening 715 is aligned or overlapping portions of the capping layer 410 and HK/MG 240 on the left side.

Figure 8A:
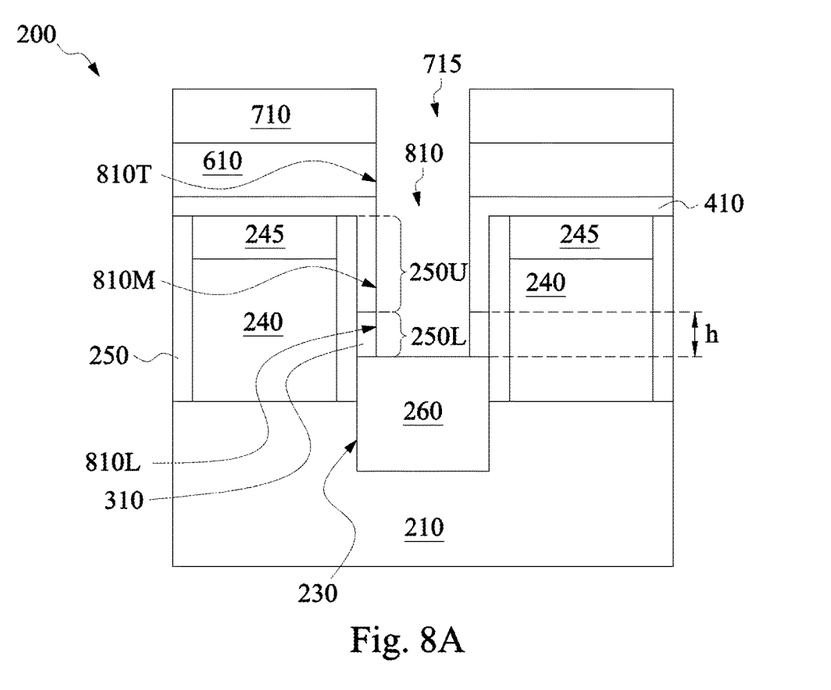

Referring to FIGS. 1 and 8A (in conjunction with the process described with respect to FIG. 7A), method 100 proceeds to step 114 by etching the second and the first dielectric layers, 610 and 310, through the opening 715 to form a contact trench 810 and expose the S/D features 260. The trench etch may include a wet etch, a dry etch, and/or a combination thereof. As has been mentioned above, the trench etch process is chosen to selectively etch the second and first dielectric layers, 610 and 310, without substantially etching the gate HM 245 and the capping layer 410. Accordingly, the gate spacers 250 are protected by the capping layer 410 during the etching process. The capping layer 410 allows for relaxed etching constraints. In some embodiments, the selective trench etch includes a plasma dry etching process using a fluorine-based chemistry, such as $CF_4$, $SF_6$, $CH_2F_2$, $CHF_3$, and/or $C_2F_6$ and the contact trench 810 is formed with a vertical profile or a taper profile.

As a result, the first dielectric layer 310 underneath the capping layer 410 remains intact. Thus, the contact trench 810 has a top portion 810T defined by the second dielectric layer 610, a middle portion 810M defined by the capping layer 410 and a lower portion 810L defined by the first dielectric layer 310, as shown in FIG. 8A. The top, middle and lower portions, 810T, 810M and 810L, have a straight-line profile. The lower portion 810L has a height that is the same as the height h of the first dielectric layer 310. In other words, the capping layer 410 is disposed along upper portions 250U of the spacers 250, respectively, and the first dielectric layer 310 along lower portions 250L of the spacers 250, respectively. The first dielectric layer 310 physically contacts the capping layer 410 and a top surface of the first dielectric layer 310 is above a top surface of the S/D feature 260.

Figure 8B:
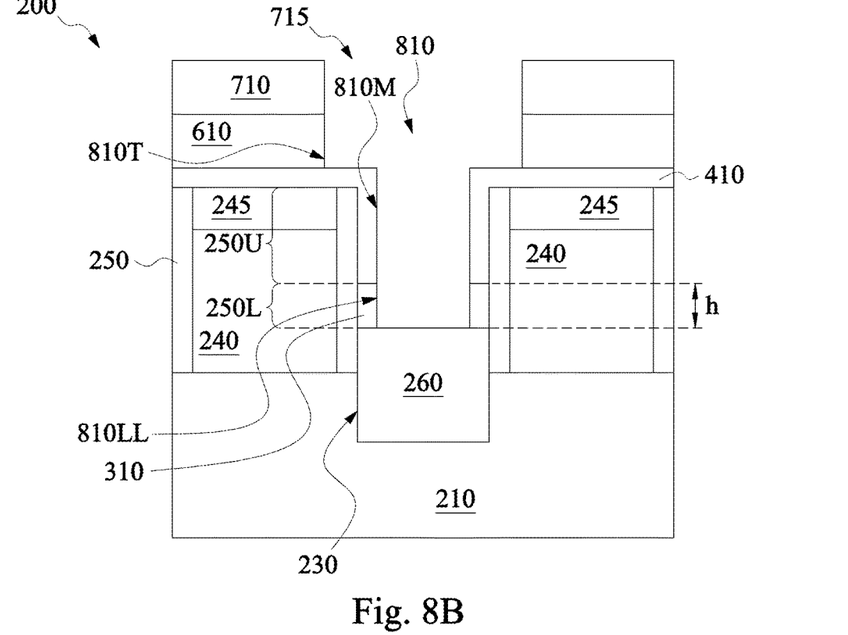

As shown in FIG. 8B, for circumstances where opening 715 is expands over both sides of the adjacent gates HM 245 and the capping layers 410 (in conjunction with the process described with respect to FIG. 7B), the exposed portions of the gate HM 245 and the capping layers 410 serve as a sub-etch-mask to protect the gate stack 240 and the gate spacers 250. Accordingly, the top portion 810T is defined by the second dielectric layer 610, the middle portion 810M is defined by the capping layer 410 and the lower portion 810L is defined by the first dielectric layer 310. Thus, here contact trench 810 has a symmetrical profile when comparing the left and right sides of the trench. Specifically, contract trench 810 shown in FIG. 8B is stair stepped on both the left and right sides where the top portion 810 transitions to the middle portion 810M of the trench. The lower portion 810L has a height that is same as the height h of the first dielectric layer 310. Also, as shown, the top portion 810T is wider than the middle portion 810M and the lower portion 810L of contact trench 810.

Figure 8C:
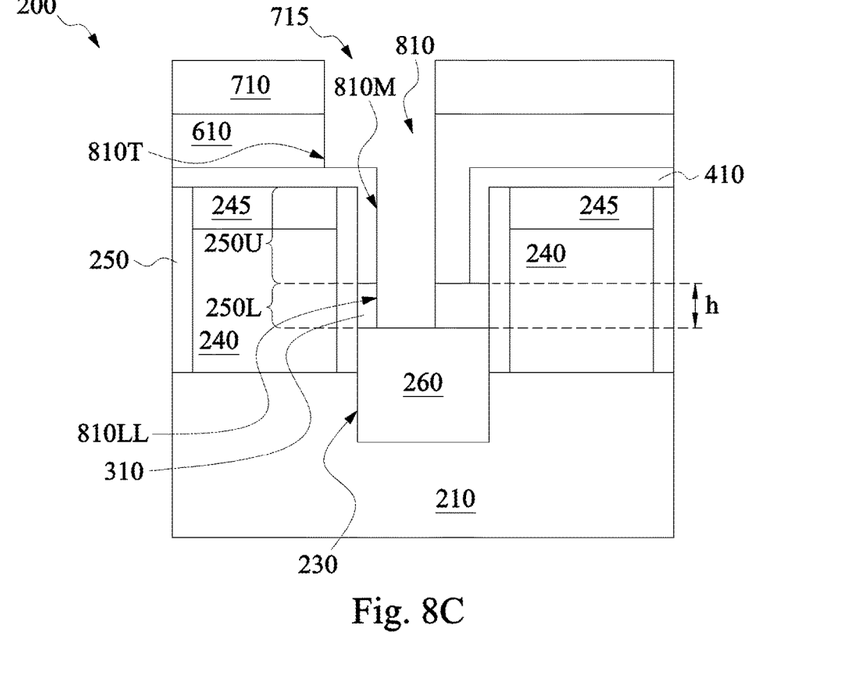

As shown in FIG. 8C, for circumstances where opening 715 is disposed over the gate HM 245 and the capping layer 410 on the left side (in conjunction with the process described with respect to FIG. 7C), the exposed portions of the gate HM 245 and the capping layer 410 serve as a sub-etch-mask to protect the gate stack 240 and the gate spacers 250 on the left side. Also, as shown, the second dielectric layer 610 and the capping layer 410 provide protection for the gate spacer 250 and the gate stack 240 depicted on the right side of the figure. Accordingly, on the left side of contact trench 810, the top portion 810T is defined by the second dielectric layer 610, the middle portion 810M and the lower portion 810L is defined by the first dielectric layer 310. And, on the right side, the top portion 810T and the middle portion 810M are defined by the second dielectric layer 610 and the lower portion 810L is defined by the first dielectric layer 310, as shown in FIG. 8C. Thus, contact trench 810 here has an asymmetric profile when comparing the left and right sides of the trench. Specifically, the left side of contact 810 in FIG. 8C is stair stepped where the top portion 810 transitions to the middle portion 810M of the trench while the right side of the trench has a straight-line profile.

After forming the contact trench 810, the HM 710 is removed by another etch process. In one example where the HM 710 is a photoresist pattern, the HM 710 is removed by wet stripping and/or plasma ashing.

Figure 9A:
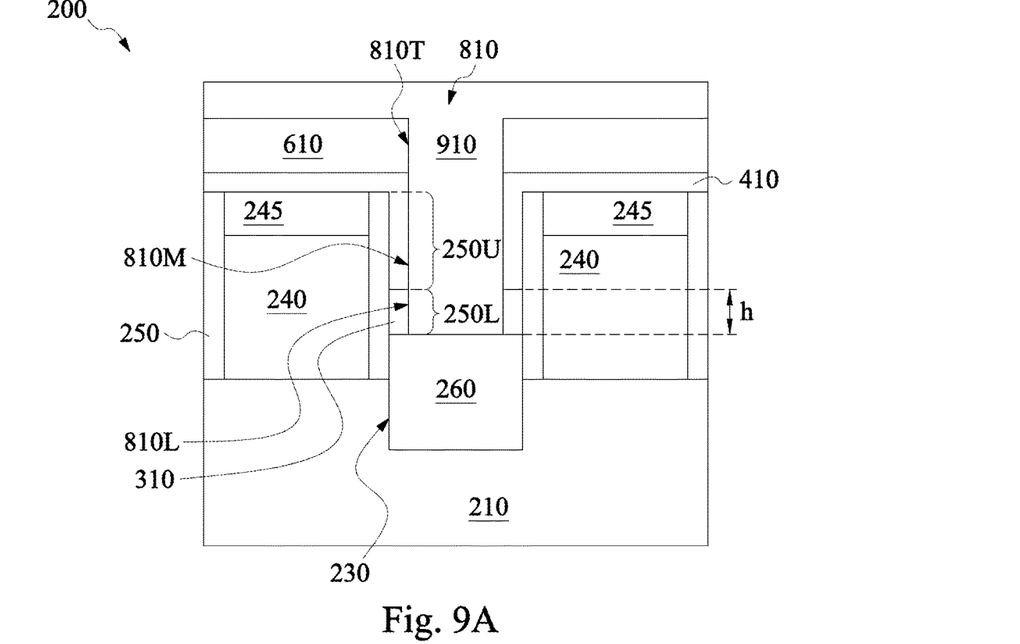

Referring to FIGS. 1 and 9A (in conjunction with the process described with respect to FIG. 8A), method 100 proceeds to step 116 by forming a metal (or conductive) layer 910 in the contact trench 810. In the present embodiment, the metal layer 910 includes include cobalt (Co), copper (Cu), copper, copper magnesium (CuMn), copper aluminum (CuAl) or copper silicon (CuSi), aluminum (Al), tungsten (W), and/or other suitable conductive material. The metal layer 910 may be deposited by ALD, PVD, CVD, metal-organic chemical vapor deposition (MOCVD), plating, and/or other techniques.

Figure 9B:
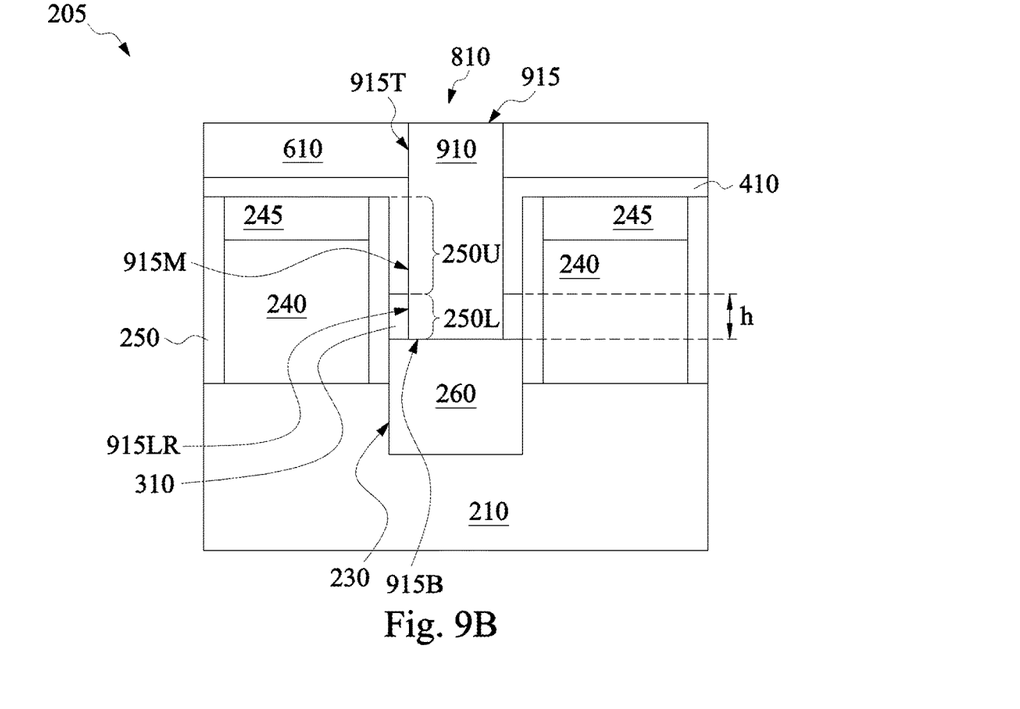

Additionally, a recess process is performed to recess excessive metal layer 910 over the second dielectric layer 610 as shown in FIG. 9B. In some embodiments, a chemical mechanical polishing (CMP) process is performed to remove excessive metal layer 910. The remaining metal layer 910 in the contact trench 810 forms a contact metal 915. In the present embodiment, the contact metal 915 is formed such that a bottom portion 915B physically contacts the S/D feature 260, a lower portion 915L (on both sides) physically contacts the first dielectric layer 310, a middle portion 915M (on both sides) physically contacts the capping layer 410 and a top portion 915T (on both sides) physically contacts the second dielectric layer 610.

Figure 9C:
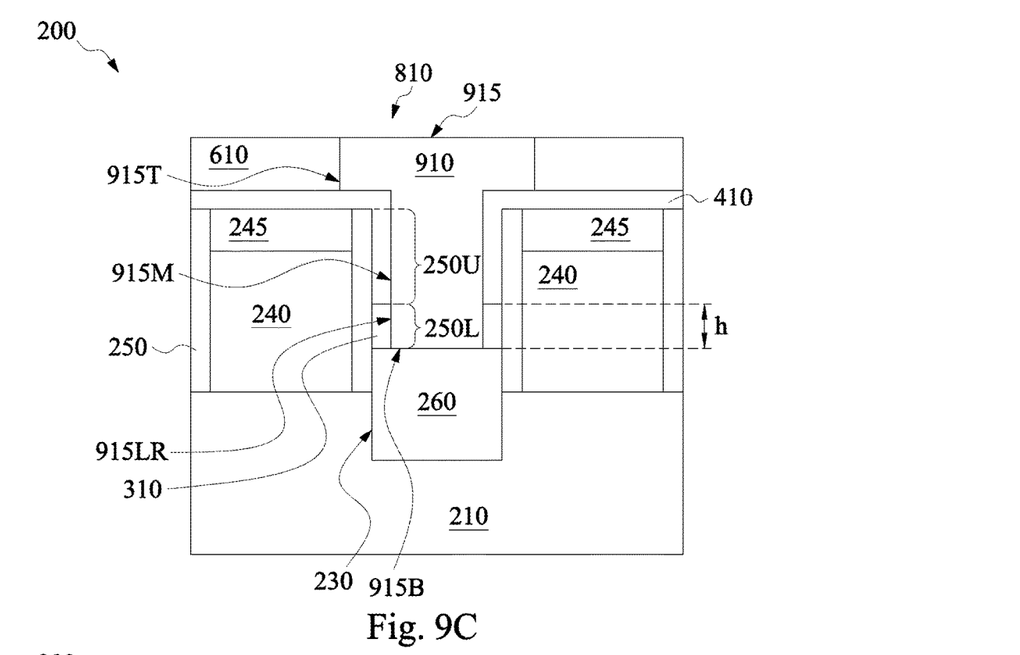

In conjunction with the process described with respect to FIG. 8B above, the contact metal 915 is formed such that the bottom portion 915B physically contacts the S/D feature 260, the lower portion 915L (on both sides) physically contacts the first dielectric layer 310, the middle portion 915M (on both sides) physically contacts the capping layer 410 and the top portion 915T (on both sides) physically contact the second dielectric layer 610, as shown in FIG. 9C.

Figure 9D:
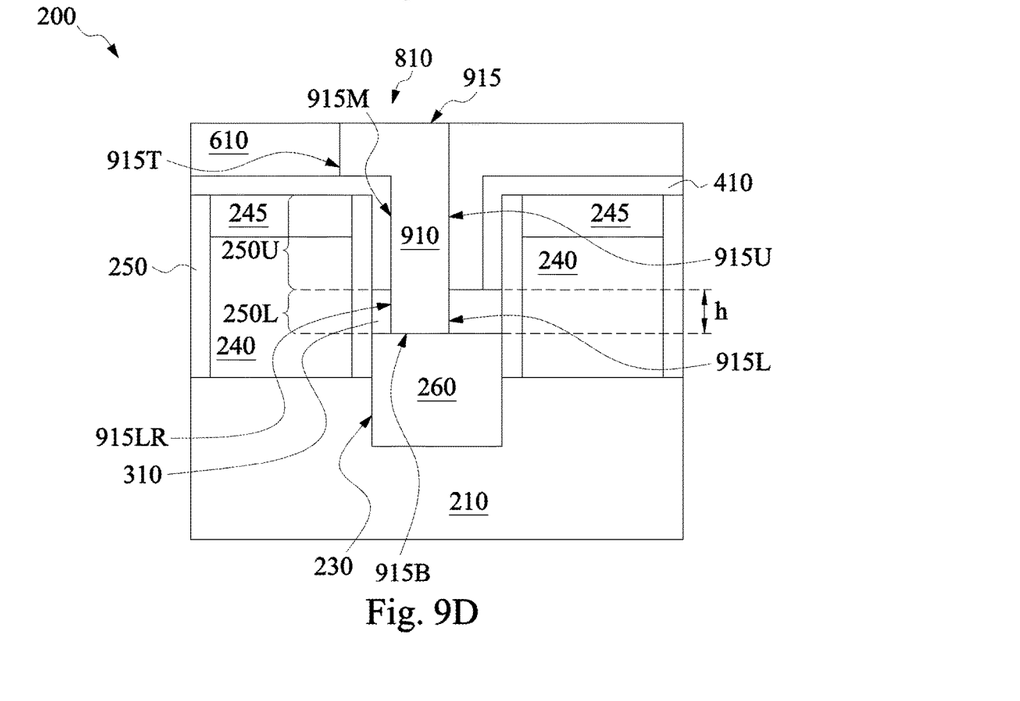

In conjunction with the process described with respect to FIG. 8C above, the contact metal 915 is formed such that the bottom portion 915B physically contacts the S/D feature 260. Furthermore, the lower portion 915L physically contacts the first dielectric layer 310 (on both sides), the middle portion 915M physically contacts the capping layer 410 on the left side and physically contacts the second dielectric layer 610 on the right side, and the top portion 915T physically contact the second dielectric layer 610 (on both sides).

Additional steps can be provided before, during, and after the method 100, and some of the steps described can be replaced, eliminated, or moved around for additional embodiments of the method 100.

The semiconductor devices, 200, may include additional features, which may be formed by subsequent processing. For example, various vias/lines and multilayers interconnect features (e.g., metal layers and interlayer dielectrics) are formed over the substrate 210. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, it can be seen that the present disclosure provide methods of forming a contact trench. The method employs forming a capping layer along an upper portion of a gate spacer to protect gate spacer during forming contact trench. The method provides a robust contact metal formation process.

The present disclosure provides many different embodiments of fabricating a semiconductor device that provide one or more improvements over existing approaches. In one embodiment, a method for fabricating a semiconductor device includes forming a first gate stack and a second gate stack over a substrate, the first and second gate stacks having gate spacers disposed along their respective sidewalls. The method also includes forming a source/drain (S/D) feature over the substrate. The source/drain feature is disposed between the first and second gate stacks. The gate spacers and a top surface of the S/D feature define a space. The method also includes forming a first dielectric layer over the S/D feature in the space and forming a capping layer along the gate spacers in the space. The capping layer has a different etch selectivity than the gate spacers. The method also includes forming a second dielectric layer over the first dielectric layer in the space and forming a contact trench extending through the second dielectric layer, the first dielectric layer and the capping layer to expose the top surface of the S/D feature.

In yet another embodiment, a method includes forming a first gate stack and a second gate stack over a substrate, the first and second gate stacks having gate spacers disposed along their respective sidewalls. The method also includes forming a source/drain (S/D) feature over the substrate. The source/drain feature is disposed between the first and second gate stacks. The gate spacers and a top surface of the S/D feature define a space. The method also includes forming a first dielectric layer in the space, recessing the first dielectric in the space, forming a capping layer along the gate spacers in the space, forming a second dielectric layer over the first dielectric layer in the space and forming a contact trench extending through the second dielectric layer, the first dielectric layer and the capping layer to the S/D feature. The method also includes forming a conductive material in the contact trench.

In yet another embodiment, a semiconductor device includes a first and a second gate stacks disposed over a substrate, having spacers along sidewalls, respectively. The device also includes a source/drain (S/D) feature separates the first and second gate stacks, a capping layer disposed along upper portions of the spacers, respectively and a dielectric layer along lower portions of the spacers, respectively. The dielectric layer physically contacts the capping layer and a top surface of the dielectric layer is above a top surface of the S/D feature. The device also includes a metal feature disposed over the S/D feature such that a bottom of the metal feature physically contacts the S/D feature, a lower portion of sidewall of the metal feature physically contacts the dielectric layer and an upper portion of sidewall of the metal feature physically contacts the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first gate stack and a second gate stack over a substrate;
    forming gate spacers on sidewalls of the first gate stack and the second gate stack respectively;
    forming a source/drain (S/D) feature over the substrate, wherein the S/D feature is disposed between the first gate stack and the second gate stack, wherein the gate spacers and a top surface of the S/D feature define a space;
    forming a first dielectric layer over the S/D feature in the space;
    forming a capping layer over the first gate stack, the second gate stack, and the gate spacers on the sidewalls of the first gate stack and the second gate stack, and in the space;
    performing a first etching process to form an opening in the capping layer between the first gate stack and the second gate stack, wherein the opening exposes a top surface of the first dielectric layer;
    after performing the first etching process, forming a second dielectric layer in the opening and directly on the first dielectric layer in the space between the first gate stack and the second gate stack; and
    while maintaining the capping layer over the first gate stack, the second gate stack, and over the gate spacers on the sidewalls of the first gate stack and the second gate stack, performing a second etching process to form a contact trench extending through the second dielectric layer and the first dielectric layer to expose the top surface of the S/D feature.

2. The method of claim 1, wherein forming the first dielectric layer over the S/D feature in the space includes:
    depositing the first dielectric layer in the space; and
    recessing the first dielectric layer within the space, wherein the recessing forms a top surface of the first dielectric layer below a top surface of the first gate stack and a top surface of the second gate stack.

3. The method of claim 1, wherein the forming the contact trench includes forming a mask layer over the second dielectric layer, wherein the mask layer defines an opening disposed over the first gate stack, and
    performing the second etching process on the second dielectric layer using the mask layer to form the contact trench having an asymmetrical profile.

4. The method of claim 1, wherein forming the contact trench extending through the second dielectric layer and the first dielectric layer to expose the top surface of the S/D feature includes:
    forming a hard mask over the second dielectric layer and the first gate stack and the second gate stack, wherein the hard mask defines an opening; and
    a second etching process includes etching the second dielectric layer and the first dielectric layer through the opening.

5. The method of claim 1, wherein after forming the contact trench extending through the second dielectric layer and the first dielectric layer to expose the top surface of the S/D feature, a portion of the first dielectric layer remains disposed under a portion of the capping layer.

6. The method of claim 1, wherein forming the contact trench extending through the second dielectric layer and the first dielectric layer to expose the top surface of the S/D feature includes performing an anisotropic dry etching process.

7. The method of claim 1, further comprising forming a metal layer in the contact trench.

8. A method comprising:
    forming a first metal gate stack and a second metal gate stack over a substrate;
    forming gate spacers abutting respective sidewalls of the first metal gate stack and second metal gate stack;
    forming a source/drain (S/D) feature over the substrate, wherein the S/D feature is disposed between the first metal gate stack and second metal gate stack, wherein the gate spacers abutting respective sidewalls of the first metal gate stack and the second metal gate stack and a top surface of the S/D feature define a space;
    recessing a first dielectric layer in the space between the first metal gate stack and the second metal gate stack, wherein the recessing provides the first dielectric layer having an uppermost surface below a top surface of the first metal gate stack and the second metal gate stack;

after forming the first and second metal gate stacks and recessing the first dielectric layer, forming a capping layer along the gate spacers in the space;

etching an opening in the capping layer above the S/D feature;

after etching the opening, forming a second dielectric layer over the capping layer, in the opening, and over the first dielectric layer in the space;

after forming the second dielectric layer, forming a contact trench extending through the second dielectric layer and the first dielectric layer to the S/D feature; and forming a conductive material in the contact trench.

9. The method of claim 8, wherein etching the capping layer includes:

removing a portion of the capping layer to form the opening that exposes the first dielectric layer while maintaining the capping layer over the first metal gate stack and the second metal gate stack and along sidewalls of the gate spacers.

10. The method of claim 9, wherein forming the second dielectric layer over the first dielectric layer includes forming the second dielectric layer directly on the first dielectric layer within the opening.

11. The method of claim 4, wherein the etching the second dielectric layer and the first dielectric layer through the opening is a selective etch maintaining the capping layer over the first gate stack and the second gate stack and extending along sidewalls of the gate spacers.

12. The method of claim 11, wherein the etching the second dielectric layer and the firsts dielectric layer exposes a portion of the capping layer disposed over the first gate stack.

13. The method of claim 8, wherein the forming the contact trench extending through the second dielectric layer and the first dielectric layer to the S/D feature exposes a portion of the capping layer formed along sidewalls of the gate spacers.

14. A method, comprising:

providing a first gate stack, a second gate stack and a first dielectric layer interposing the first gate stack and the second gate stack over a substrate;

forming a first gate spacer abutting the first gate stack and a second gate spacer abutting the second gate stack;

forming a capping layer over the first gate stack, the second gate stack, the first gate spacer, the second gate spacer, and first dielectric layer, wherein the capping layer has a first portion extending over the first gate stack and a second portion extending over the second gate stack and wherein a space is defined between a sidewall of the first portion of the capping layer and a sidewall of the second portion of the capping layer, and wherein the space exposes a top surface of the first dielectric layer;

after forming the first portion of the capping layer, the second portion of the capping layer and the space, depositing a second dielectric layer over the first dielectric layer in the space while maintaining the first portion of the capping layer and the second portion of the capping layer;

forming a mask element over the second dielectric layer, wherein the mask element includes an opening;

etching the second dielectric layer and the first dielectric layer through the opening to form a contact trench while maintaining the first portion of the capping layer and the second portion of the capping layer; and forming a conductive material in the contact trench, wherein the conductive material interfaces at least one of the first portion or the second portion of the capping layer.

15. The method of claim 14, wherein forming the capping layer includes forming the capping layer interfacing a source/drain feature disposed on the substrate.

16. The method of claim 8, wherein the forming the capping layer includes forming the capping layer over the first metal gate stack and over the second metal gate stack; and wherein after etching the opening in the capping layer above the S/D feature the capping layer is maintained over the first metal gate stack and over the second metal gate stack.

* * * * *